(12) United States Patent
Vaufrey et al.

(10) Patent No.: US 12,538,616 B2
(45) Date of Patent: Jan. 27, 2026

(54) LIGHT EMITTING DIODE WITH OPTIMISED ELECTRIC INJECTION FROM A SIDE ELECTRODE

(71) Applicant: COMMISSARIAT A L'ENERGIE ATOMIQUE ET AUX ENERGIES ALTERNATIVES, Paris (FR)

(72) Inventors: David Vaufrey, Grenoble (FR); Tony Maindron, Grenoble (FR); Corentin Le Maoult, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 434 days.

(21) Appl. No.: 18/192,021

(22) Filed: Mar. 29, 2023

(65) Prior Publication Data

US 2023/0352622 A1 Nov. 2, 2023

(30) Foreign Application Priority Data

Apr. 1, 2022 (FR) ..................... 22 03005

(51) Int. Cl.
*H10H 20/816* (2025.01)
*H10H 20/01* (2025.01)

(52) U.S. Cl.
CPC ...... *H10H 20/8162* (2025.01); *H10H 20/018* (2025.01); *H10H 20/0137* (2025.01)

(58) Field of Classification Search
CPC .................................................. H10H 20/8162
USPC ......................................................... 257/99
See application file for complete search history.

(56) References Cited

U.S. PATENT DOCUMENTS

| 2011/0198664 A1 | 8/2011 | Kang |
| 2015/0014736 A1 | 1/2015 | Vaufrey |
| 2021/0126157 A1 | 4/2021 | Dupre et al. |

FOREIGN PATENT DOCUMENTS

| CN | 104157767 A | 11/2014 | |
| FR | 3 008 547 A1 | 1/2015 | |
| FR | 3102613 A1 * | 4/2021 | ........... H10H 29/142 |

OTHER PUBLICATIONS

French Search Report issued Nov. 21, 2022 in FR 22 03005 filed on Apr. 1, 2022.

* cited by examiner

*Primary Examiner* — Hsin Yi Hsieh
(74) *Attorney, Agent, or Firm* — Oblon, McClelland, Maier & Neustadt, L.L.P.

(57) ABSTRACT

A light-emitting diode comprising:
a first electrode;
a first layer of semiconductor doped to a first conductivity type;
a second layer of semiconductor doped to a second conductivity type;
a region of radiative recombination arranged between, or at the interface of, the first and second layers;
a third layer of semiconductor doped to the second conductivity type;
a fourth semiconductor layer arranged between the second and third layers;
a second electrode arranged against a side face of the third layer and against only part of a side face of the fourth layer;
and wherein the fourth layer forms, in relation to the third layer, an energy barrier of at least 100 MeV.

10 Claims, 3 Drawing Sheets a)   b)   c)

LIGHT EMITTING DIODE WITH OPTIMISED ELECTRIC INJECTION FROM A SIDE ELECTRODE

TECHNICAL FIELD

The invention relates to the field of LEDs (light-emitting diodes), and more precisely to that of LEDs with one of the electrodes as a side contact.

PRIOR ART

An LED is generally composed of a stack of at least two semiconductor materials of opposite conductivity type, forming electric charge carrier transport layers, and inserted between two electrodes. A recombination region, forming an active region made up, for example, of one or several superimposed quantum wells, is present between the two semiconductor materials of opposite conductivity type. When a voltage is applied between the two electrodes, electric charge carriers are injected via said electrodes into the stack of semiconductors, then transported in the semiconductors. Electrons are injected from the cathode (electrode in contact with the n-type semiconductor), whilst holes are injected from the anode (electrode in contact with the p-type semiconductor). Electron-hole pairs can thus be formed in the active region of the stack, generating photons that escape from the stack of semiconductors through an emissive surface of the LED which is generally located on the side of one of the two electrodes.

In order to maximise the light output of the LED, the emissive surface of the LED should be maximised by minimising the surface occupied by the electrode located on the side of the emissive surface. The document FR 3 008 547 A1 describes an LED in which the electrode located on the side of the emissive surface of the LED is produced in the form of a side electrical contact, i.e. arranged against a side face of the stack, thus completely freeing the emissive surface of the LED.

Other improvements also exist to increase the light output of an LED.

For example, in order to prevent the diffusion of dopants in the active region of the LED, which would reduce its ability to convert electron-hole pairs into photons at the desired wavelength, it is known to introduce a non-doped semiconductor layer adjacent to the active region, for example between the active region and the n-doped semiconductor layer.

Moreover, in particular with GaN-based LEDs, it is known to introduce a layer for blocking carriers adjacent to the active region of the LED, with the goal of confining the carriers in question in the active region. This is referred to as an "electron blocking layer" (EBL) or "hole blocking layer" (HBL). These layers are characterised by their closeness with the active region and by their different nature allowing a barrier to be formed against the flow of the carriers. For example, in a GaN-based LED, an EBL composed of AlGaN or InAlGaN (the gap of which is greater than that of GaN) may be inserted between the active region and the p-doped GaN-based hole transport layer.

In order to limit growth defects in the active region of an LED, it is also known to start the growth of the semiconductor of the LED on a growth substrate (for example of silicon) with thick layers or alternating layers of materials with different lattice parameters that gradually approach that of the material of the active region. Such layers, named buffer layers, thus make it possible to at least partly compensate for the difference in lattice parameter between the growth substrate and the semiconductor making up the active region of the LED. These buffer layers are not electrically active (because no current flows through them) and are electrically undoped as well. In the case of a VTF-type LED ("vertical thin film"), the buffer layers are removed during the LED manufacturing process.

In addition, the efficiency of an LED is the product of several efficiencies including extraction, i.e. the probability of a photon escaping from the LED stack. Various methods exist to enhance extraction, one in particular being to reduce the thickness of the stack of semiconductors forming the LED so as to generate Fabry Perot-type constructive interference and limit the optical absorption of this stack.

Careful positioning of the electrodes also makes it possible to uniformly distribute the current in the active region of the LED. Indeed, a uniform distribution of the current in the active region of the LED increases its efficiency because the local current density flowing in the LED is minimised. Various electrode geometries make it possible to uniformly distribute the current in the active region of the LED.

It is also possible to improve the uniformity of distribution of the current in the active region of the LED by producing a thick charge transport (and therefore doped) layer, and/or by introducing a so-named spreading layer, characterised by a higher conductivity than that of the semiconductor on which it is formed. This interface between these two materials with different conductivity enables the uniformity of distribution of the current to be improved.

It proves difficult to meet both the constraints of optimising the extraction and those of standardising the distribution of the current which are at odds, in particular in LEDs with a small thickness. Indeed, in order to optimise the efficiency of an LED, it is vital to optimise the extraction of an LED. However, in order to optimise the extraction, it is desirable to minimise the thickness of the semiconductor stack in order to limit the optical absorption induced by the LED materials and to achieve constructive light interference conditions. At the same time, in order to distribute the current uniformly across the active region of the LED, and consequently achieve the highest optical flows, it is necessary to increase the thickness of a transport layer and/or to use a spreading layer and make it as conductive as possible in order to minimise ohmic losses.

This criticality is increased by the use of an electrode in the form of a side electrical contact. Indeed, unlike a planar electrode, i.e. an electrode formed on a normal plane in the direction of growth of the semiconductor stack, injection through a side electrode is not uniform because the injected current density is higher on the parts of the electrode closest to the counter electrode (and therefore a priori the active region).

For example, in order to produce an LED comprising a side electrode, the various layers of the stack are first produced on a growth substrate. An electrode layer is then formed at the top of the stack. A transfer substrate is then secured to the electrode layer, then the growth substrate is removed from the stack, for example by laser lift-off, or adiabatic heating by laser pulses. The face of the stack freed from the growth substrate is then etched and polished. Etching is then performed on the stack in order to form mesa-type structures on the substrate, each of which are intended to form an LED. A dielectric material is then deposited in a conformal manner, covering particularly the polished faces and the side faces of the mesa-type structures. Anisotropic etching is then performed to remove the dielectric material over a thickness that depends on the time of etching chosen, thus revealing the side faces of the mesa-type structures over the etched thickness. The side electrodes are then produced by using the remaining dielectric material as a support for the deposition of the electrically conductive material forming the side electrodes.

The anisotropic etching performed is, however, delicate because:
- the thickness of etched dielectric material depends on the duration of the etching process and not on the position of an etch stop layer;
- it does not compensate for the non-uniformities induced by the polishing performed after removal of the growth substrate.

The consequence of these difficulties is that the position of the side electrode in relation to the other electrode can fluctuate by several hundreds of nanometres for LEDs produced on different substrates. Moreover, on a same substrate, this position also varies given the dispersion of the thickness of the semiconductor stack formed on the substrate, caused in particular by the polishing performed after the growth substrate is removed. These variations in the position of the side electrode result in variations in the injection of the electric charge carriers from the side electrode, which has an impact on LED performance.

DESCRIPTION OF THE INVENTION

Therefore there is a need to propose a light-emitting diode, the structure of which makes it possible to control the position of the injection of electric charge carriers in the stack of the light-emitting diode from the side electrode.

To do this, one embodiment proposes a light-emitting diode comprising:
- a first electrode;
- a first layer of semiconductor doped to a first conductivity type and comprising a first face arranged on the first electrode side;
- a second layer of semiconductor doped to a second conductivity type, opposite to the first conductivity type;
- a region of radiative recombination of electric charge carriers of the first and second conductivity types arranged between, or at the interface of, a second face, opposite the first face, of the first layer and a first face of the second layer;
- a third layer of semiconductor doped to the second conductivity type;
- a fourth layer of semiconductor arranged between a second face, opposite the first face, of the second layer and the third layer;
- a second electrode arranged against at least part of at least one side face of the third layer and against only part of at least one side face of the fourth layer;
- and wherein the semiconductor of the fourth layer forms, in relation to the semiconductor of the third layer, an energy barrier of at least 100 MeV against a flow of electric charge carriers of the second conductivity type from the second electrode to the second layer.

In this LED, the fourth layer is inserted between the second and third layers of semiconductor doped to the second conductivity type which together form the electric charge transport layer of this second conductivity type. The difference in energy barrier at the interface between the semiconductor of the fourth layer and the side electrode and the semiconductor of the third layer and the side electrode results in the electric charges injected from the side electrode entering the semiconductor stack of the LED through the third layer, near the interface formed with the fourth layer, and not through the fourth layer. The presence of the fourth layer within the electric charge transport layer thus makes it possible to guarantee the location, or position, of the semiconductor stack at which the electric charges of the second conductivity type are injected.

Moreover, this energy barrier between the fourth and third layer also results in a spreading of the electric charges in the third layer before they pass through the fourth layer to reach the active region of the LED, and thus a uniform current density within the LED.

The insertion of the fourth layer between the second and third doped layers makes it possible to accurately position the electric charge carrier injection region from the side electrode and makes it possible to eliminate the non-uniformities in thickness of the semiconductor stack caused by the production of the LED or LEDs.

The fourth layer differs from an EBL or HBL-type layer in that it is not in contact with the emissive region of the LED, i.e. with the region of radiative recombination of electric charge carriers.

The fourth layer also differs from the buffer layers in that a current flows through it when the LED is in operation.

The fourth layer also differs from a spreading layer because it forms an energy barrier that is not obtained with a spreading layer, and it is formed with the same steps as those forming the second and third layers.

The LED may have advantageously a low thickness, i.e. the total thickness of which is less than or equal to around 2 μm and preferably 1 μm.

Throughout the document, the term "LED" and the terminology "light-emitting diode" are also used to describe micro-LEDs.

The light-emitting diode may advantageously be used for applications requiring diodes with small lateral dimensions and low thickness, for example for producing high-resolution displays, in particular intra-retinal projection type applications.

In order for the semiconductor of the fourth layer to form, in relation to the semiconductor of the third layer, an energy barrier of at least 100 MeV against the flow of electric charge carriers of the second conductivity type from the second electrode to the second layer, it is proposed, for example, that:
- the semiconductor of the fourth layer is non-doped or is doped to the second conductivity type with a doping level less than that of the semiconductor of the third layer, and/or
- the alloy composition, or atomic composition, of the semiconductor of the fourth layer is different from that of the semiconductor of the third layer.

Advantageously, the first conductivity type may correspond to p-type and the second conductivity type may correspond to n-type.

The electrical conductivity of the third layer may be greater than that of the second layer.

In one exemplary embodiment, the third layer may comprise at least two sub-layers of increasing conductivity in the direction from the fourth layer to the emissive face.

The second electrode may form a ring laterally surrounding the third layer over its entire thickness and laterally surrounding only part of the fourth layer, said part of the fourth layer being arranged against the third layer. In this configuration, considering that a first part of the fourth layer corresponds to that surrounded by the second electrode and that a second part of the fourth layer corresponds to that which is not surrounded by the second electrode, the first part of the fourth layer is arranged between the second part of the fourth layer and the third layer, and the second part of the fourth layer is arranged between the first part of the fourth layer and the second layer.

The thickness of the different layers of the LED corresponds to the dimension of these layers which is, in the case of an LED in the form of a slab, perpendicular to the interfaces formed between these layers.

The semiconductors of the first, second, third and fourth layers may be III-V semiconductors, comprising, for example, GaN, InGaN, AlGaN, InAlGaN, GaP, AsGa, etc.

The region of radiative recombination of electric charge carriers of the first and second conductivity types may comprise one or several quantum wells each formed by at least one semiconductor emissive layer arranged between at least two semiconductor barrier layers.

In one particular configuration, the light-emitting diode may also comprise:
- a non-doped semiconductor layer arranged between the region of radiative recombination of electric charge carriers of the first and second conductivity types and the second layer, and designed to form an electrical dopant diffusion barrier, and/or
- a layer for blocking electric charge carriers of the second conductivity type arranged between the region of radiative recombination of electric charge carriers of the first and second conductivity types and the first layer, and comprising a semiconductor doped to the first conductivity type and the gap of which is greater than that of the semiconductor of the first layer.

Such a blocking layer may be P-doped, which allows it to block the electrons and is positioned between the active layer and the P-doped semiconductor layer. Alternatively, this blocking layer may be N-doped, which allows it to block the holes and is positioned between the active layer and the N-doped semiconductor layer.

Another embodiment relates to a method for producing a light-emitting diode comprising:
producing a stack of layers on a first substrate including:
a) a first electrode layer arranged on the first substrate;
b) a first layer of semiconductor doped to a first conductivity type and comprising a first face arranged on the first electrode layer side;
c) a second layer of semiconductor doped to a second conductivity type, opposite to the first conductivity type;
d) a region of radiative recombination of electric charge carriers of the first and second conductivity types arranged between, or at the interface of, a second face, opposite the first face, of the first layer and a first face of the second layer;
e) a third layer of semiconductor doped to the second conductivity type;
f) a fourth layer of semiconductor arranged between a second face, opposite the first face, of the second layer and the third layer;
etching the stack such that remaining portions of the stack form at least one mesa-type structure;
conformal deposition of a dielectric layer, covering at least an upper face and side faces of the mesa-type structure;
anisotropic etching of part of the thickness of the dielectric layer, revealing at least part of at least one side face of the third layer and only part of at least one side face of the fourth layer;
producing an electrode, named a second electrode, against said at least part of at least one side face of the third layer and against said part of at least one side face of the fourth layer;
and wherein the semiconductor of the fourth layer forms, in relation to the semiconductor of the third layer, an energy barrier of at least 100 MeV against the flow of electric charge carriers of the second conductivity type from the second electrode to the second layer.

Producing the stack of layers may comprise the following steps:
epitaxy of the first, second, third and fourth layers and of the region of radiative recombination on a growth substrate, such that the third layer is arranged between the growth substrate and the fourth layer;
deposition of the first electrode layer on the first layer;
securing the first electrode layer to the first substrate which corresponds to a transfer substrate;
removing the third layer from the growth substrate;
etching and chemical-mechanical polishing of the face of the third layer previously arranged against the growth substrate.

Throughout the document, the term "over" is used irrespective of the orientation in space of the element to which this term relates. For example, in the feature "over a face of the substrate", this face of the substrate is not necessarily oriented upwards but may correspond to a face oriented in any direction. Furthermore, the arrangement of a first element over a second element should be understood as possibly corresponding to the arrangement of the first element directly against the second element, without any intermediate element between the first and second elements, or as possibly corresponding to the arrangement of the first element over the second element with one or more intermediate element(s) disposed between the first and second elements.

BRIEF DESCRIPTION OF THE DRAWINGS

The present invention will be better understood after reading the following description of exemplary embodiments, given for purposes of illustration only and not intended to limit the scope of the invention, with reference to the accompanying drawings, in which.

Identical, similar or equivalent portions of the different figures described hereinafter bear the same reference numerals so as to facilitate switching from one figure to another.

The different portions shown in the figures are not necessarily according to a uniform scale, in order to make the figures more readable.

The different possibilities (alternatives and embodiments) must be understood as not being mutually exclusive and can be combined with one another.

DETAILED DESCRIPTION OF PARTICULAR EMBODIMENTS

Figure 1:
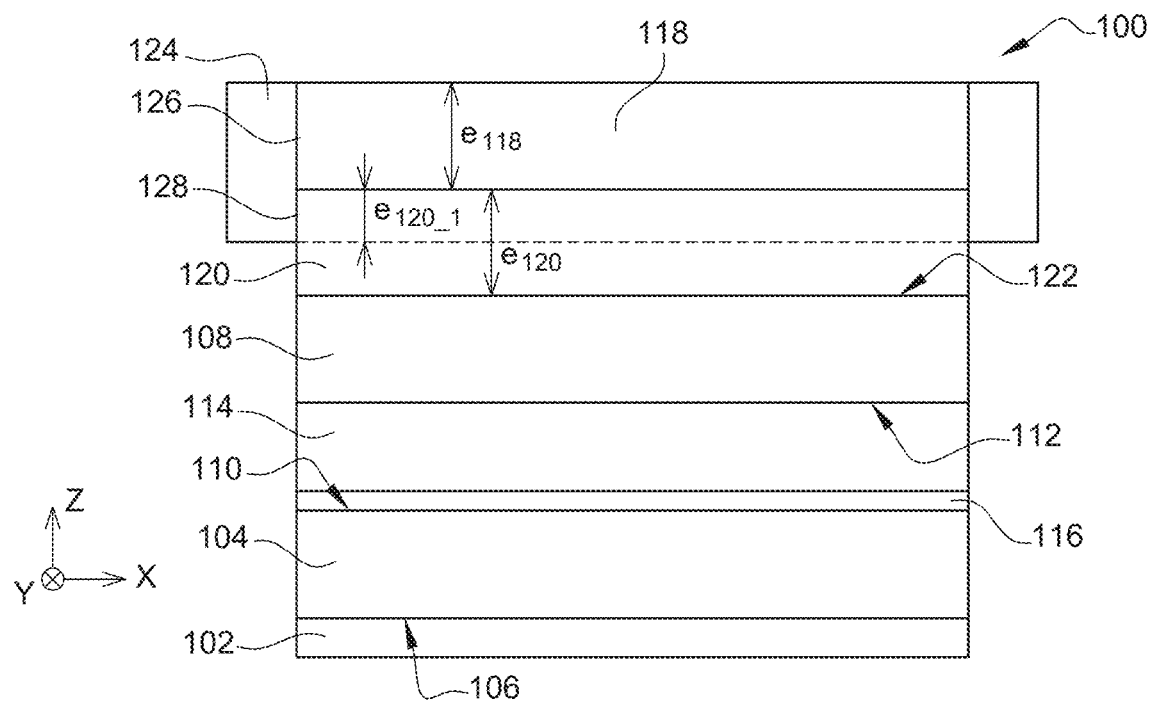
FIG. 1 is a sectional view of a light-emitting diode according to a particular embodiment.

A light-emitting diode 100 according to one particular embodiment is described below in relation to FIG. 1 which is a sectional view of this diode 100.

The diode 100 comprises a first electrode 102 as well as a first layer 104 of semiconductor doped to a first conductivity type. The first layer 104 comprises a first face 106 arranged on the first electrode 102 side.

In the exemplary embodiment described here, the first conductivity type corresponds to p-type. The first electrode 102 thus corresponds to the anode of the diode 100. In addition, according to this exemplary embodiment, the first electrode 102 may comprise at least one of the following materials: Ti, Ag, Cr, Al, TiN, W, Cu, Au, ITO (indium tin oxide). The first electrode 102 may have a thickness of between 10 nm and 2 µm. Moreover, in this exemplary embodiment, the first layer 104 comprises GaN, or more generally any III-V semiconductor such as InGaN, AlGaN, InAlGaN, GaAs, GaP, etc. The first layer 104 may have a thickness of between, for example, 50 and 300 nm if it is P-doped GaN. The doping level of the semiconductor of the first layer 104 is, for example, between $1^e17$ and $5^e21$ atoms/cm$^3$.

The diode 100 also comprises a second layer 108 of semiconductor doped to a second conductivity type, opposite to the first conductivity type, i.e. n-type in this exemplary embodiment. In addition, according to this exemplary embodiment, the second layer 108 comprises GaN, or more generally any III-V semiconductor such as one of those previously mentioned for the first layer 104. The semiconductor of the second layer 108 may be similar or not to that of the first layer 104. The second layer 108 may have a thickness of between 200 nm and 20 µm. The doping level of the semiconductor of the second layer 108 is, for example, between $1^e17$ and $5^e21$ atoms/cm$^3$.

The diode 100 also comprises a region 114 of radiative recombination of electric charge carriers of the first and second conductivity types between a second face 110, opposite the first face 106, of the first layer 104 and a first face 112 of the second layer 108. In the exemplary embodiment described here, this region 114 comprises one or several quantum wells each formed by at least one non-doped semiconductor emissive layer arranged between at least two semiconductor barrier layers. The layers forming the region 114 comprise III-V semiconductor. For example, the barrier layers may comprise GaN, and the emissive layers may comprise InGaN.

In the exemplary embodiment described here, the diode 100 also comprises an electron blocking layer 116 arranged between the region 114 of the first layer 104 (and against the second face 110 of the first layer 104) and comprising a semiconductor, in this instance of type III-V, doped to the same conductivity type as the first layer 104 (p-type in the exemplary embodiment described here) and the gap of which is greater than that of the semiconductor of the first layer 104. For example, when the first layer 104 comprises p-doped GaN, the electron blocking layer 116 may comprise p-doped AlGaN or p-doped InAlGaN.

According to a first variant, whether or not the diode 100 comprises the electron (or hole) blocking layer 116, it is possible that the diode 100 comprises a non-doped semiconductor layer (not shown in FIG. 1) arranged between the region 114 and the second layer 108 (and against the first face 112 of the second layer 108) and configured to form an electrical dopant diffusion barrier. This diffusion barrier may comprise a III-V semiconductor, for example similar to that of the second layer 108 (of GaN in the exemplary embodiment described here).

According to a second variant, it is possible that the diode 100 comprises neither the electron or hole blocking layer 116 nor the layer forming a dopant diffusion barrier.

According to a third variant that is compatible with the first and second variants outlined above, it is possible that the region 114 does not comprise any quantum wells, but simply corresponds to the interface between the second face 110 of the first layer 104 and the first face 112 of the second layer 108.

The diode 100 also comprises a third layer 118 of semiconductor doped to the second conductivity type. The semiconductor of the third layer 118 is, for example, similar to that of the second layer 108, both in terms of atomic composition (GaN in the example described here) and doping level.

The diode 100 also comprises a fourth layer 120 of semiconductor arranged between a second face 122, opposite the first face 112, of the second layer 108 and the third layer 118.

The diode 100 also comprises a second electrode 124 arranged against at least part of at least one side face 126 of the third layer 118 and against only part of at least one side face 128 of the fourth layer 120. The second electrode 124 advantageously forms a ring laterally surrounding the third layer 118 over its entire thickness (in FIG. 1, the total thickness of the third layer 118 is named $e_{118}$) and laterally surrounding the fourth layer 120 over only part of its thickness (in FIG. 1, the total thickness of the fourth layer 120 is named $e_{120}$, and that of the part of the fourth layer 120 surrounded by the second electrode 124 is named $e_{120\_1}$). The thickness of the second electrode 124, named $e_{124}$ in FIG. 1, is equal to the sum of the total thickness of the third layer 118 and the thickness of the part of the fourth layer 120 surrounded by the second electrode 124 ($e_{124}=e_{118}+e_{120\_1}$, where $e_{120\_1}<e_{120}$). In FIG. 1, the thicknesses correspond to the dimensions parallel to the Z axis, and are perpendicular here to the faces 106, 110, 112 and 122 of the layers of the stack produced.

In the diode 100, the second, third and fourth layers 108, 118, 120 together form the electric charge transport layer of the second conductivity type of the diode 100.

The semiconductor of the fourth layer 120 forms, in relation to the semiconductor of the third layer 118, an energy barrier of at least 100 MeV against the flow of electric charge carriers of the second conductivity type from the third layer 118 to the fourth layer 120. This energy barrier results in a difference in energy barrier between the second electrode 124 and the third layer 118 and between the third layer 118 and the fourth layer 120. The injection of electric carriers is therefore disadvantaged at the interface between the electrode 124 and the third layer 118 compared to that at the interface between the electrode 124 and the fourth layer 120.

According to one embodiment, the energy barrier formed between the semiconductors of the third and fourth layers 118, 120 is obtained because the gap of the semiconductor of the fourth layer 120 is at least 100 MeV greater than the gap of the semiconductor of the third layer 118. Such a gap may be obtained by producing these third and fourth layers 118, 120 such that the alloy composition of the semiconductor of the fourth layer 120 is different from that of the semiconductor of the third layer 118 (for example, by increasing the proportion of aluminium in the semiconductor of the fourth layer 120 compared to the semiconductor of the third layer 118).

According to another embodiment, the energy barrier formed between the semiconductors of the third and fourth layers 118, 120 is obtained because the semiconductor of the fourth layer 120 is non-doped or is doped to the second conductivity type with a doping level less than that of the semiconductor of the third layer 118.

According to another embodiment, the energy barrier formed between the semiconductors of the third and fourth layers 118, 120 is obtained due to the difference in doping between the semiconductors of the third and fourth layers 118, 120, and due to the difference in alloy composition between the semiconductors of the third and fourth layers 118, 120.

In the case of an energy barrier due to a difference in doping between these semiconductors, this doping difference may be expressed by the equation:

$$\Delta V = kT \ln\left(\frac{N_{118}, N_{120}}{n_i^2}\right) \quad \text{[Math 1]}$$

where $\Delta V$ is the height of the energy barrier which is greater than or equal to 100 MeV, k is the Boltzmann constant, T is the temperature at which the diode 100 is found, $N_{118}$ is the concentration of ionised dopants in the semiconductor of the third layer 118, $N_{120}$ is the concentration of ionised dopants in the semiconductor of the fourth layer 120, and $n_i$ is the concentration of electric charge carriers intrinsic to the semiconductor of the third and fourth layers 118, 120.

In the case of a difference in gap between the semiconductors of the third and fourth layers 118, 120 due to a difference in atomic composition of the semiconductors, the value of this difference in gap is a function of the nature of the semiconductors used to form the layers 118, 120. In the case of n-doped layers 118, 120, with the fourth layer 120 thus forming an electron barrier, the difference in gap corresponds to the sum of the offset of the semiconductor conduction bands of these layers and the curve of these bands. It is, for example, possible to calculate an estimate of this offset of the conduction bands by performing the following steps:

determining the gap of the semiconductors of the layers 118 and 120 when they are intrinsic, for example using a database of such data, or by calculation (see, for example, the document A. Goyal et al., "Band gap bowing parameter in pseudomorphic $Al_xGa_{1-x}N/GaN$ high electron mobility transistor structures", Journal of Applied Physics 117, 225702 (2015), which deals with the gap variation of GaN as a function of its Al composition and the stress in the layer) then calculating the levels of the valence and conduction bands of each semiconductor based on previously determined gap values, then calculating the position of the Fermi level of each semiconductor to determine the energy differences between the valence or conduction band and the Fermi level of each semiconductor, then calculating the difference between the two previously calculated positions which corresponds to the desired offset value.

These calculations may be performed, for example, using a simulation software such as ATLAS by Silvaco.

The various elements of the diode 100 described above are made in the form of a mesa-type structure, the cross-section of which, in a plane parallel to each of the interfaces between these elements, is for example rectangular in shape. However, other shapes are possible.

Due to the fact that the second electrode 124 is in contact with the third layer 118 and is not in contact with the second layer 108, and that the semiconductor of the fourth layer 120 forms an energy barrier to the semiconductor of the third layer 118, the electric charge carriers supplied from the second electrode 124 enter the semiconductor stack of the diode 100 from the third layer 118, near the interface with the fourth layer 120, and not directly from the side faces of the fourth layer 120. This difference in gap and/or doping between the third and fourth layers 118, 120 also results in a distribution of the electric charge carriers in the third layer 118 before they pass to the second layer 108 through the fourth layer 120 which forms a barrier for the passage of the carriers from the third layer 118 to the fourth layer 120.

The fourth layer 120 thus makes it possible to improve the uniformity of distribution of the current in the active region of the diode 100 but also to impose the position of the point on the second electrode 124 through which the maximum current density will be injected into the semiconductor stack of the diode 100.

Figure 2:
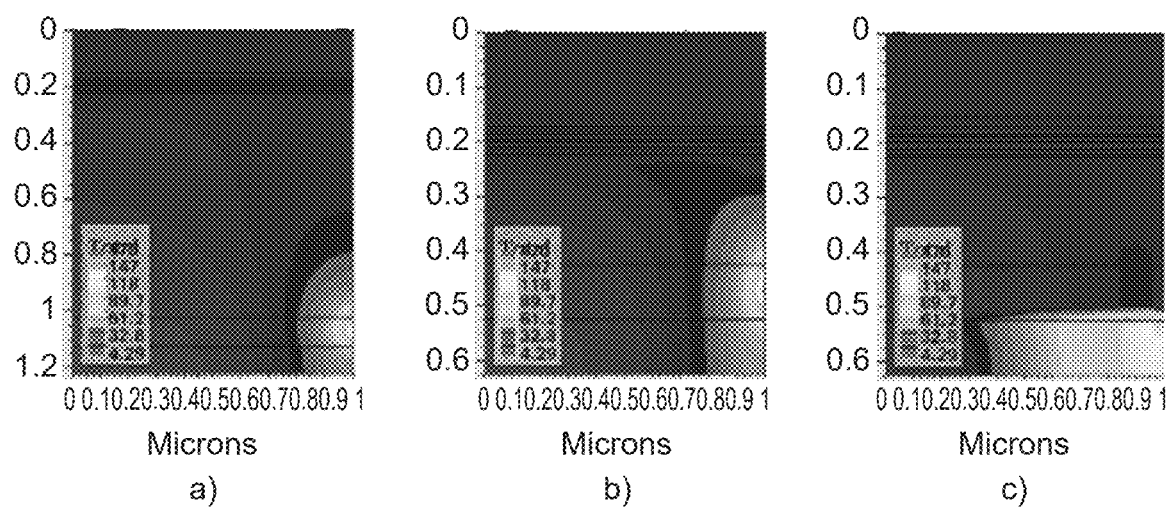
FIG. 2 shows simulations of current density mapping for a light-emitting diode according to one embodiment and for other diodes not comprising a fourth layer.

FIG. 2 shows a plurality of simulations of current density mapping obtained in the diode 100 which comprises a semiconductor stack with a total thickness equal to around 0.6 μm (simulation bearing the reference "c)"), as well as in diodes not comprising the fourth layer 120, and the thickness of which is either similar to that of the simulated diode 100 (simulation bearing the reference "b)") or greater (simulation bearing the reference "a)"). For these three simulations, the second electrode 124 extends from the bottom of the stack over a thickness between the two black horizontal lines visible on the bottom of each simulation.

These simulations show that the highest current density injected from the second electrode 124 corresponds to the point on the second electrode 124 closest to the active region (simulations a) and b)), except in the case of the diode 100 (simulation c)) in which the position of the maximum current density is imposed by the position of the fourth layer 120 within the charge carrier transport layer formed by the second and third layers 108, 118. In the simulations of FIG. 2, the lighter regions of the stack correspond to the regions where the current density is the highest. In other words, the introduction of the fourth layer 120 into the transport layer makes it possible to impose the injection position of the second electrode 124 and consequently to relax the constraints on the technological steps involved in producing this second electrode 124.

The difference in gap and/or doping between the semiconductor of the fourth layer 120 and that of the third layer 118 makes it possible in particular to form an injection barrier for the part of the second electrode 124 in contact with the fourth layer 120, this barrier being absent or reduced for the part of the second electrode 124 that is in contact with the third layer 118.

It should be noted that the three LED's, the current density mapping of which is simulated and shown in FIG. 2, have substantially the same electrical characteristics current=f(voltage), which means that the introduction of the fourth layer 120 within the charge transport layer formed by the second and third layers 108, 118 does not have a negative impact on the electro-optical behaviour of the LED.

The fourth layer 120 is preferably arranged within the doped transport layer having the greatest conductivity out of the two n- and p-doped transport layers of the diode 100, i.e. the transport layer forming the so-named spreading layer within the diode 100. In the previously described exemplary embodiment, the fourth layer 120 is arranged within the n-doped transport layer formed by the second and third layers 108, 118. In the event that the transport layers are of equivalent conductivity, the fourth layer 120 may be interchangeably formed in either of the doped transport layers, i.e. on the anode side or on the cathode side (but on the side where the electrode is lateral).

The previously described exemplary diode 100 corresponds to a variant of a VTF-type diode. Alternatively, the diode 100 may correspond to a variant of a CC-type diode ("conventional chip") or FC-type diode ("flip chip") or even TFFC-type diode ("thin film flip chip").

An exemplary method for producing light-emitting diodes 100 is described below in relation to FIGS. 3A to 3F.

Figure 3A:
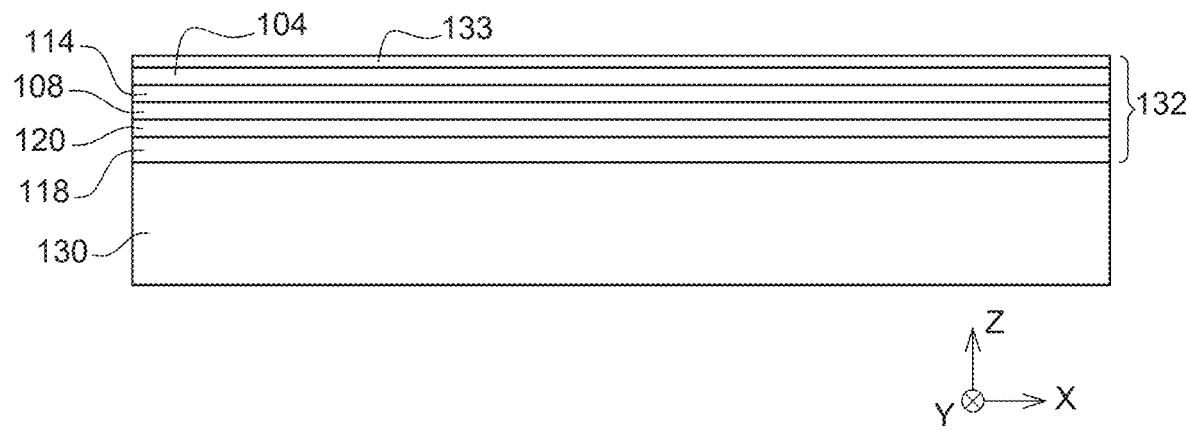
FIGS. 3A-3F show the steps of a method for producing a light-emitting diode according to a particular embodiment.

As shown in FIG. 3A, a stack of layers 132 is produced on a growth substrate 130, which corresponds, for example, to a semiconductor wafer. The stack 132 comprises here:
the third layer 118 arranged on the growth substrate 130;
the fourth layer 120 arranged on the third layer 118;
the second layer 108 arranged on the fourth layer 120;
the region 114 of radiative recombination;
the first layer 104.

The layers 118, 120, 108, 104 and the region 114 are formed here by epitaxy.

The stack 132 also comprises a first electrode layer 133 deposited on the first layer 104.

The first electrode layer 133 is then secured to a first substrate 135 which corresponds to a transfer substrate. This bonding is, for example, a metal-to-metal bonding or a direct bonding.

The third layer 118 is then removed from the growth substrate 130, for example by laser lift-off.

Figure 3B:
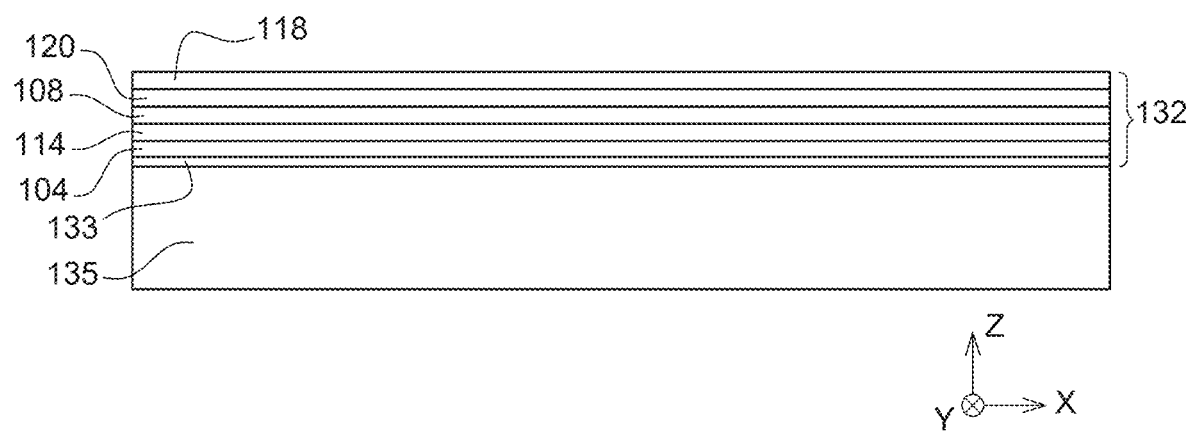

Etching and chemical-mechanical polishing of the face of the third layer 118 previously secured to the growth substrate 130 are then performed. The structure obtained at this stage of the method is shown in FIG. 3B.

Figure 3C:
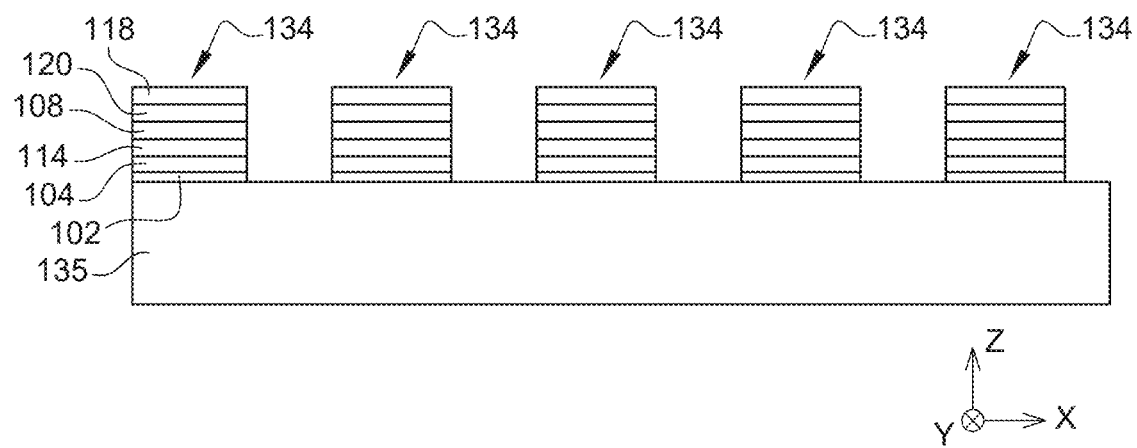

The stack 132 is then etched such that remaining portions of the stack form mes-type structures 134, each intended to form an LED (FIG. 3C). Each of the mesa-type structures 134 comprises, for example, a rectangular-shaped section in a plane parallel to the plane (X, Y).

Figure 3D:
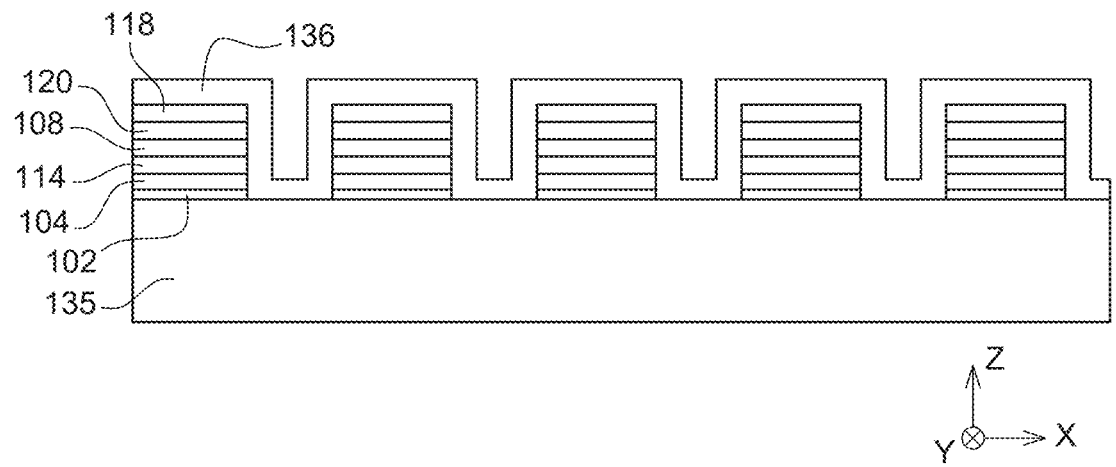

A dielectric layer 136 is then deposited in a conformal manner on the mesa-type structures 134 and the substrate 135, covering particularly the upper faces and the side faces of the mesa-type structures 134 (FIG. 3D).

Figure 3E:
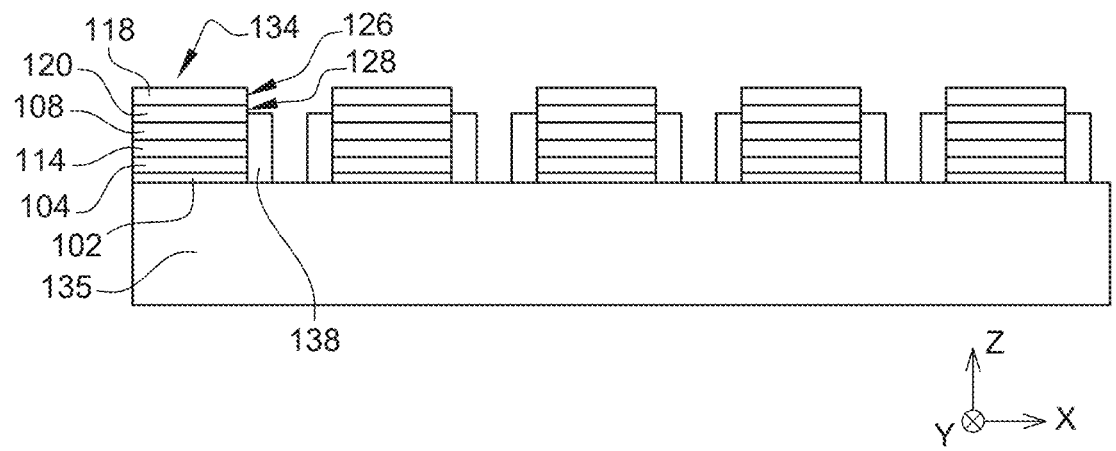

Part of the thickness of the dielectric layer 136 is then anisotropically etched (FIG. 3E). The remaining portions of the dielectric layer 136 are designated by the reference 138. This etching reveals, for each mesa-type structure 134, the side faces 126 of the third layer 118 and only part of the side faces 128 of the fourth layer 120. Thus, instead of precisely controlling the etching of the dielectric layer 136 and thus the precise height of the remaining portions of the dielectric layer 136, the thickness of the fourth layer 120 offers a process latitude directly proportional to its thickness.

Figure 3F:
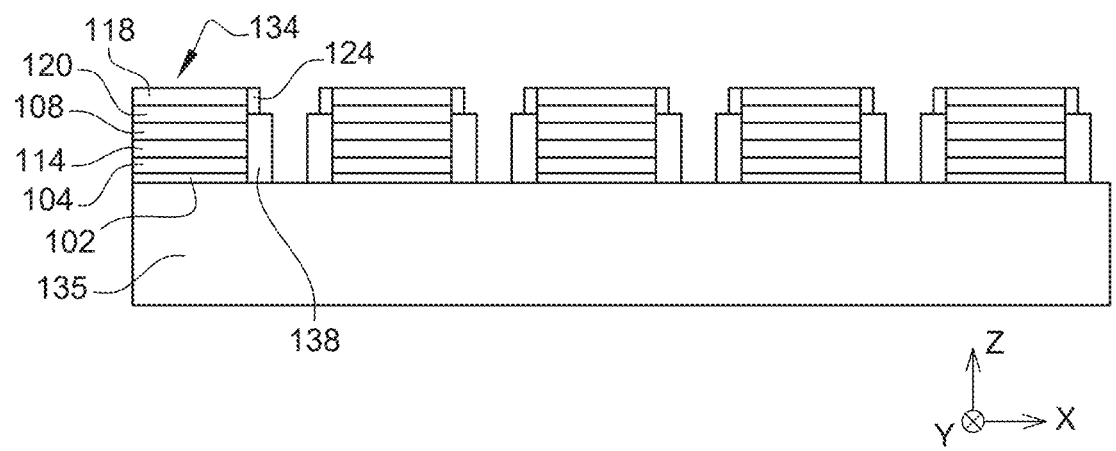

For each mesa-type structure 134, the second electrode 124 is then produced against the side faces 126 of the third layer 118 and against part of the side faces 128 of the fourth layer 120 revealed by the previous etching (see FIG. 3F). The second electrodes 124 rest on the remaining dielectric portions 138. The second electrodes 124 may be produced by conformal deposition then etching, or by ALD (atomic layer deposition) directly on the sidewalls.

It should be noted that the proposed structure limits the criticality of the manufacturing process of the LEDs 100.

Indeed, as explained in the prior art, the current distribution in an LED described by the spreading length is directly proportional to the root of the minimum distance between a point on the electrode formed on the highest conductivity layer between the layers 104 and 108 and a point in the active region. In the case of a side electrode, injection mainly occurs via the portions of the electrode closest to the active region (minimisation of losses by Joule effect). The spreading (i.e. spreading length) is controlled by the minimum distance between a point on the side electrode 124 and a point in the active region.

However, in the event of a method for producing an LED involving the transfer of the semiconductor layers onto another substrate (VTF-type), this distance is not controlled or controllable on the same plate but also from plate to plate. Indeed, the removal of the semiconductor layers (layers 104, 114, 108, 120, 118) is performed by brutal methods such as laser lift-off. The latter consists of adiabatic heating until said one or more layers between the growth substrate and the semiconductor layers through which a current actually flows during the operation of the future LED are melted. The heating and melting is induced by the absorption of said laser pulse layers. As a result, the exposed face of the semiconductor stack is deeply modified and roughened. On this side and over a considerable depth, the disorder is such that many states in the gap appear and lead to a very significant loss of transparency. However, this is the side through which the photons emitted by the future LED are expected to escape.

Therefore, in order to overcome these shortcomings or roughness, full plate etching is performed to remove the materials of different composition from the semiconductors making up the LED stack, followed by polishing of this etched face. However, this polishing step combined with the aforementioned etching does not make it possible to precisely control the remaining thickness of the semiconductor stack and consequently the distance detailed above which determines the spreading in the LED. It should be noted that the remaining thickness and the distance that determines the spreading cannot be finely controlled from plate to plate but also on the same plate, as the CMP (polishing) induces thickness variations on the same low frequency plate. Under these conditions, the efficiency of the LEDs, depending on the spreading, would be variable within the same plate and between plates.

By imposing the point of injection of the carriers from the side electrode, it considerably reduces the criticality of the manufacturing process to obtain LEDs with similar electro-optical characteristics since the spreading length is controlled.

It would be incumbent on the person skilled in the art to adapt the thickness $e_{120}$ of the layer 120 as a function of the precision of their manufacturing process, because the greater this thickness, the more the method constraints are relaxed, with, on the other hand, an excessive thickness $e_{120}$ possibly leading to a shift in the operating voltages of the LED.

The proposed LED structure is also particularly well suited to LEDs with small lateral dimensions, often named μLEDs. LEDs with small dimensions often suffer from reduced efficiency in particular because:
it is difficult to form an electrode on the emissive face that does not cover a significant portion of that emissive face. The efficiency of the μLED is therefore significantly impaired by the weakness of its extraction;
the reduced lateral dimensions of the μLED mean that the electro-optical behaviour of the μLED depends much more on the side effects than for macroscopic LEDs. At the edge of the μLED, the etching to form mesas (singularization of the μLEDs) has resulted in a large number of defects in the semiconductor gap required for non-radiative recombinations known as SRH (Shockley Read Hall). SRH recombinations compete with radiative ones and therefore reduce the electro-optical efficiency of the LED. In the case of an LED provided with a side electrode and in particular if it has a low thickness (=short spreading length), the charge carriers are concentrated at the periphery of the LED (see FIGS. 2a and 2b), feeding the defects in the gap and thus non-radiative recombinations, which leads to a sharp drop in the electro-optical efficiency of the LED.

The implementation of the proposed structure in the case of µLEDs guarantees high extraction as the emissive face is not obstructed by an electrode and ensures a controlled distribution of the carriers in the active region.

CITATIONS

1: FR 3 008 547 A1
2: A. Goyal et al., "Band gap bowing parameter in pseudomorphic $Al_xGa_{1-x}N$/GaN high electron mobility transistor structures", Journal of Applied Physics 117, 225702 (2015).

The invention claimed is:

1. A light-emitting diode comprising:
a first electrode;
a first layer of semiconductor doped to a first conductivity type and comprising a first face arranged on the first electrode;
a second layer of semiconductor doped to a second conductivity type, opposite to the first conductivity type;
a region of radiative recombination of electric charge carriers of the first and second conductivity types arranged between, or at an interface of a second face, opposite the first face, of the first layer and a first face of the second layer;
a third layer of semiconductor doped to the second conductivity type;
a fourth layer of semiconductor arranged between a second face, opposite the first face, of the second layer and the third layer; and
a second electrode arranged against at least part of at least one side face of the third layer and against only part of at least one side face of the fourth layer;
wherein the semiconductor of the fourth layer forms, in relation to the semiconductor of the third layer, an energy barrier of at least 100 MeV against a flow of electric charge carriers of the second conductivity type from the second electrode to the second layer.

2. The light-emitting diode according to claim 1, wherein:
the semiconductor of the fourth layer is non-doped or is doped to the second conductivity type with a doping level less than that of the semiconductor of the third layer, and/or
the alloy composition of the semiconductor of the fourth layer is different from that of the semiconductor of the third layer.

3. The light-emitting diode according to claim 1, wherein the first conductivity type corresponds to p-type and the second conductivity type corresponds to n-type.

4. The light-emitting diode according to claim 1, wherein the electrical conductivity of the third layer is greater than that of the second layer.

5. The light-emitting diode according to claim 1, wherein the second electrode forms a ring laterally surrounding the third layer over its entire thickness and laterally surrounding only part of the fourth layer, said part of the fourth layer being arranged against the third layer.

6. The light-emitting diode according to claim 1, wherein the semiconductors of the first, second, third and fourth layers are III-V semiconductors.

7. The light-emitting diode according to claim 1, wherein the region of radiative recombination of electric charge carriers of the first and second conductivity types comprises one or several quantum wells each formed by at least one semiconductor emissive layer arranged between at least two semiconductor barrier layers.

8. The light-emitting diode according to claim 1, further comprising:
a non-doped semiconductor layer arranged between the region of radiative recombination of electric charge carriers of the first and second conductivity types and the second layer, and designed to form an electrical dopant diffusion barrier, and/or
a layer for blocking electric charge carriers of the second conductivity type arranged between the region of radiative recombination of electric charge carriers of the first and second conductivity types and the first layer, and comprising a semiconductor doped to the first conductivity type, wherein a gap of the semiconductor of the layer for blocking electric charge carriers is greater than that of the semiconductor of the first layer.

9. A method for producing a light-emitting diode comprising:
producing a stack of layers on a first substrate including:
a) a first electrode layer arranged on the first substrate;
b) a first layer of semiconductor doped to a first conductivity type and comprising a first face arranged on the first electrode layer;
c) a second layer of semiconductor doped to a second conductivity type, opposite to the first conductivity type;
d) a region of radiative recombination of electric charge carriers of the first and second conductivity types arranged between, or at an interface of a second face, opposite the first face, of the first layer and a first face of the second layer;
e) a third layer of semiconductor doped to the second conductivity type;
f) a fourth layer of semiconductor arranged between a second face, opposite the first face, of the second layer and the third layer;
etching the stack such that remaining portions of the stack form at least one mesa-type structure;
conformal deposition of a dielectric layer, covering at least an upper face and side faces of the mesa-type structure;
anisotropic etching of part of the thickness of the dielectric layer, revealing at least part of at least one side face of the third layer and only part of at least one side face of the fourth layer; and
producing an electrode, named a second electrode, against said at least part of at least one side face of the third layer and against said only part of at least one side face of the fourth layer;
wherein the semiconductor of the fourth layer forms, in relation to the semiconductor of the third layer, an energy barrier of at least 100 MeV against a flow of electric charge carriers of the second conductivity type from the second electrode to the second layer.

10. The method according to claim 9, wherein producing the stack of layers comprising the following steps:
epitaxy of the first, second, third and fourth layers and of the region of radiative recombination on a growth substrate, such that the third layer is arranged between the growth substrate and the fourth layer;

deposition of the first electrode layer on the first layer;

securing the first electrode layer to the first substrate which corresponds to a transfer substrate;

removing the third layer from the growth substrate; and etching and chemical-mechanical polishing of a face of the third layer previously arranged against the growth substrate.

* * * * *